(12) United States Patent
Dijon et al.

(10) Patent No.: US 10,337,102 B2
(45) Date of Patent: Jul. 2, 2019

(54) PROCESS FOR PRODUCING A GRAPHENE FILM

(71) Applicant: COMMISSARIAT À L'ENERGIE ATOMIQUE ET AUX ENERGIES ALTERNATIVES, Paris (FR)

(72) Inventors: Jean Dijon, Champagnier (FR); Anastasia Tyurnina, Grenoble (FR)

(73) Assignee: COMMISSARIAT À L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 15/124,158

(22) PCT Filed: Mar. 6, 2015

(86) PCT No.: PCT/FR2015/050551
§ 371 (c)(1),
(2) Date: Sep. 7, 2016

(87) PCT Pub. No.: WO2015/132537
PCT Pub. Date: Sep. 11, 2015

(65) Prior Publication Data
US 2017/0016111 A1 Jan. 19, 2017

(30) Foreign Application Priority Data

Mar. 7, 2014 (FR) ...................... 14 00560

(51) Int. Cl.
C23C 16/26 (2006.01)
C23C 14/06 (2006.01)
C23C 14/26 (2006.01)
C23C 16/455 (2006.01)
(Continued)

(52) U.S. Cl.
CPC ............ *C23C 16/26* (2013.01); *C01B 32/186* (2017.08); *C23C 14/0605* (2013.01); *C23C 14/26* (2013.01); *C23C 16/455* (2013.01); *C23C 16/46* (2013.01)

(58) Field of Classification Search
CPC ........................... C23C 16/26; C23C 14/0605
See application file for complete search history.

(56) References Cited

U.S. PATENT DOCUMENTS

2003/0230238 A1* 12/2003 Papadimitrakopoulos ................. C23C 14/042
118/715
2013/0337195 A1* 12/2013 Wurstbauer ......... C01B 31/0446
427/585

(Continued)

FOREIGN PATENT DOCUMENTS

CN 101913598 A * 12/2010

OTHER PUBLICATIONS

Machine Translation CN 101913598, retrieved Jun. 14, 2017.*

*Primary Examiner* — David P Turocy
(74) *Attorney, Agent, or Firm* — Oliff PLC

(57) ABSTRACT

Fabrication method of a graphene film including the following successive steps: placing the substrate and a solid carbon source in a reaction chamber, provided with a gas inlet; and heating the solid carbon source, by flow of a current in said source, under a gas flow, the gas being devoid of hydrocarbon, so as to convert at least a part of the solid carbon source into a graphene film on the substrate.

15 Claims, 2 Drawing Sheets

(51) Int. Cl.
 *C23C 16/46* (2006.01)
 *C01B 32/186* (2017.01)

(56) References Cited

U.S. PATENT DOCUMENTS

2014/0170317 A1* 6/2014 Li ............................ C23C 16/26
 427/249.6
2014/0261998 A1* 9/2014 Veerasamy ............ B82Y 30/00
 156/247
2014/0352618 A1* 12/2014 Li ............................ C23C 16/26
 118/724

* cited by examiner

PROCESS FOR PRODUCING A GRAPHENE FILM

BACKGROUND OF THE INVENTION

The invention relates to a fabrication method of a graphene film and also relates to a device configured to fabricate a graphene film.

STATE OF THE ART

On account of its exceptional properties, graphene has generated an increasing interest in the scientific and industrial sectors. Graphene is in fact a promising candidate for numerous applications—energy storage, fabrication of transparent electrodes, super-capacitors etc. One of the current issues is to produce graphene of good quality, i.e. a continuous film presenting low defect densities and of uniform thickness, at low cost, in reproducible manner and on a large scale.

Among the methods enabling graphene films to be formed, chemical vapour deposition (CVD) is one of the most promising techniques. CVD methods are very attractive as they enable carbonaceous thin layers of good quality to be obtained.

The formation method of graphene on a substrate by CVD is performed in two steps. First of all, a pyrolysis is performed on a gas containing carbon atoms, generally a hydrocarbon compound. Pyrolysis enables the gas to be dissociated and carbonaceous radicals to be formed. In a second step, the graphene film is formed on the substrate from the carbonaceous radicals.

Numerous hydrocarbons can be used to synthesise graphene. The article by K. Wassei et al. (Small 8 (2012), no 9, 1415-1422) describes for example the use of methane, ethane or propane. The substrate is made from copper and has a thickness of 25 µm. The temperature used during the deposition method is 1000° C. and the pressures are comprised between 250 and 1000 mTorr. Methane is mainly used at it enables graphene films of better quality to be formed.

The article "A review of chemical vapour deposition of graphene on copper" (J. Mater. Chem. 21 (2011), 3324-3334) gives different values of parameters, described in the literature, to synthesise graphene by CVD on copper substrates with methane. Most of the copper strips have a thickness of about 25-50 µm. The temperatures are generally about 1000° C.

Graphene can also be deposited on crystals of ruthenium Ru(00001) and iridium Ir(111) using gaseous ethylene as carbon source (New Journal of Physics 11 (2009) 063046), or on platinum substrates with a thickness of 200 µm using methane, the substrate being heated to more than 1000° C. (Nature Communications 3:699, DOI 10.1038).

Most of the depositions by CVD technique are performed at high temperatures (1000-1100° C.) to be able to dissociate the hydrocarbons and to form graphene.

Nevertheless, such temperatures remain incompatible with methods using metallic thin layers as substrate. When the metallic thin layers are heated to high temperature, dewetting phenomena may in fact occur. The phenomenon is all the more marked the smaller the thickness of the metal.

Recently, a study showed that the synthesis temperature of graphene on a nickel substrate with a thickness of 25 µm, in the presence of $C_2H_2$, could be reduced to 700° C. by using an infrared lamp (Carbon, 50 (2012), pages 668-673). The pressure is $10^{-2}$ Torr. However, the graphene film obtained in this way is not uniform: it is composed of several graphene films overlapping at certain places.

OBJECT OF THE INVENTION

The object of the invention is to remedy the shortcomings of the prior art, and in particular to propose a fabrication method enabling a graphene film to be deposited on metallic thin layers.

This object tends to be achieved by the appended claims.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

The fabrication method of a graphene film comprises the following successive steps:
  placing a substrate 1 and a carbon source 2 in a reaction chamber 3, provided with a gas inlet 4,
  heating the carbon source 2, under a gas flow, so as to convert at least a part of the carbon source 2 into a graphene film on the substrate.

The carbon source 2 is a solid carbon source.

The gas is devoid of hydrocarbon.

Preferentially, the carbon source 2 is formed by at least one carbon filament. The filament is arranged between the substrate and the gas inlet.

What is meant by filament is an element of thin and elongate shape, such as a wire. The filament is electrically conducting.

Figure 1:
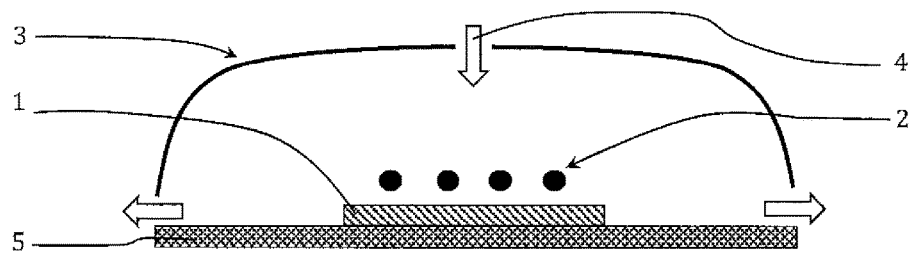
FIGS. 1 to 4 represent the device of the fabrication method of a graphene film according to different embodiments, in schematic manner, in cross-section.

As represented in FIG. 1, the carbon source 2 can comprise several filaments. The filaments advantageously form a plane parallel to the surface of the substrate.

Figure 2:
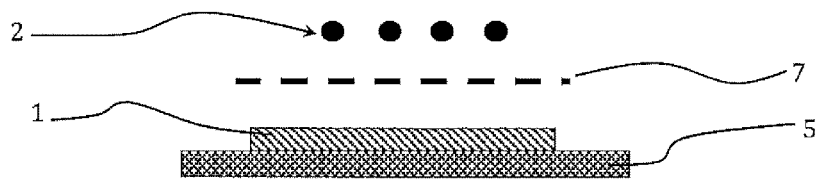

They are advantageously all located the same distance from the surface of the substrate and parallel to one another so as to form a homogeneous deposition. In FIG. 2, the filaments are represented in cross-section.

Preferentially, the filaments are equidistant from one another.

According to a preferred embodiment, the filaments are criss-crossed and parallel to the surface of the substrate so as to form a grid. The surface of the substrate is covered in more regular manner by the filaments. The grid preferably defines a plane parallel to the surface of the substrate.

Preferentially, heating of the carbon source 2 is performed by flow of a current in said source. It could also be heated by an induction heating, by laser.

Preferentially, the filaments are heated by Joule effect. When they are heated, the carbon filaments form carbon radicals necessary for formation of graphene. The quantity of carbon radicals formed is relatively small, which enables a graphene film to be formed in controlled manner.

The carbon source 2 is a solid element comprising at least 98% mass of carbon.

The carbon source 2 is preferentially made from graphite. What is meant by "made from graphite" is that the carbon source comprises at least 98% mass of graphite, and preferably at least 99.5% mass of graphite.

According to another embodiment, the carbon source 2 can further be formed by carbon nanotubes.

In conventional CVD methods, the filaments are often made from tungsten. However, the carbon of the hydrocarbons reacts with the tungsten forming parasite tungsten carbide, which contaminates the reaction chamber.

The use of carbon filaments, and in particular made from graphite, enables this pollution to be prevented.

Japanese Patent JP2003206196 also describes a CVD device not using tungsten. The filaments are carbon-based. The CVD device is used to obtain high-quality diamonds on silicon wafers.

The filaments are fabricated from a resin and a powder of carbonaceous particles. The filaments are heated to a temperature of 2050° C. in an atmosphere charged with methanol. The methanol is then decomposed, carbonaceous radicals are produced and diamond particles are formed. The temperature of the substrate is 900° C. The temperature of the substrate is nevertheless still too high. The method, even though it is suitable for forming diamond particles, does not enable graphene to be formed on thin layers.

Unlike conventional methods, the method for forming the graphene film does not require high temperatures to be used as the carbon radicals originate from the graphite filaments and not from the gas.

The high temperature of the method is limited to the carbon source.

During the method, and more particularly during the heating step, the temperature of the substrate is lower than or equal to 800° C., and preferably lower than or equal to 700° C.

The method enables graphene to be deposited on substrates which cannot be used with conventional chemical vapour deposition (CVD) methods: substrate with metallic thin layers, substrates which are damaged at high temperatures.

The gas inlet to the reaction chamber 3 via the gas inlet 4 to form the gas flow is devoid of hydrocarbon.

More particularly, the gas is devoid of carbonaceous organic molecules. What is meant by carbonaceous organic molecule is an organic molecule having a carbonaceous chain comprising at least one carbon atom. Alcohols and hydrocarbons are for example carbonaceous organic molecules.

What is meant by "devoid of" is that the gas contains less than a few parts per million (ppm) of hydrocarbons and/or of carbonaceous species.

Preferentially, the gas used is dihydrogen $H_2$.

What is meant by "dihydrogen" is that the gas comprises at least 90% volume of dihydrogen, and preferably at least 98% of dihydrogen.

According to another alternative, a mixture of $H_2+H_2O$ with a low water concentration could be used.

The presence of dihydrogen can, in the graphene growth method, enable the carbonaceous deposition to be partially etched and/or help remove impurities that may be present at the surface of the substrate.

Increasing the temperature would enable hydrogen radicals to be created enhancing formation and/or growth of the graphene film.

Advantageously, heating a carbon filament in the presence of dihydrogen enables very good-quality graphene to be created.

The dihydrogen pressure in the reaction chamber 3 is comprised between 0.1 Torr and 10 Torr, and preferably between 6 Torr and 8 Torr.

The use of such a pressure enables the quantity of carbon radicals formed to be minimised. The graphene grows slowly and few nucleation sites are formed. As there are few nucleation sites, the graphene monolayers formed have larger sizes and the graphene film is more homogeneous.

An increase of the pressure, up to ambient pressure for example, would speed up the growth process but would also lead to the formation of several graphene monolayers able to be superposed on one another.

The closer the pressure is to ambient pressure, the faster the growth of the graphene and the more difficult it is to control the number of layers of graphene deposited and the uniformity of the film.

During the method, the substrate is heated to a maximum temperature of 800° C., and preferably to a maximum temperature of 700° C.

The maximum temperature is maintained during a time ranging from 5 minutes to 5 hours. Preferably, the duration of the temperature plateau is comprised between 5 minutes and 180 minutes, and even more preferentially between 60 minutes and 120 minutes. The duration of the plateau makes it possible to control the size of the graphene grains composing the continuous film of graphene which can vary from 1-2 nm to several tens of micrometers. Whatever the duration of the plateau, it was observed that the graphene film is always continuous, uniform and defect-free.

According to one embodiment, the substrate is heated only by the carbon source: the substrate 1 is heated only by means of the heat radiated by the filaments. The carbon source 2 forms a first heat source for the substrate 1.

When the filaments are heated, they irradiate a great amount of heat and contribute to increasing the temperature of the surface of the substrate.

The filaments can be heated to temperatures of up to 1700-1800° C.: the temperature of the surface of the substrate 1, where the formation of graphene takes place, can increase to temperatures of up to 700° C.

What is meant by surface of the substrate is a thickness of several tens of nanometers extending from the free surface of the substrate, exposed to the carbon source, to the inside of the substrate, perpendicularly to the free surface of the substrate.

In general manner, the temperature of the substrate 1, at the surface and in depth, is lower than the temperature of the carbon source 2 during the heating step.

The temperature of the substrate is for example 400° C., or even 800° C., lower than the temperature of the carbon source 2.

The substrate does not need to be heated at very high temperature, which enables a large choice of equipment to be used for heating the device. The reaction chamber is less polluted and numerous materials can be used as substrate.

According to another embodiment, the substrate 1 is heated both by the filaments and by means of the second heat source 6.

The second heat source 6 is placed underneath the substrate, opposite the carbon source 2, which is placed above the substrate 1.

The second heat source 6 can for example be formed by a radiofrequency (RF) power supply connected to the support 5 of the substrate 1. The support 5 of the substrate 1 is also called sample holder.

The second heat source 6 can be a heating plate or the reaction chamber can be placed in a furnace. The person skilled in the art will be able to choose any second heat source 6 suitable for the method.

Increasing the heat emitted by the filaments enables the temperature to which the substrate 1 is heated by the second heat source to be reduced, while at the same time keeping the temperature of the surface of the substrate 1 constant.

The heat radiated by the filaments can be increased by increasing the power used to heat the filaments. The power of the power supply unit can be increased to 1000 W, which enables the temperature to which the substrate 1 is heated by the second heat source 6 to be reduced to a value of less than 450° C.

By modulating the calories emitted by the carbon source and the calories emitted by the second heat source, it is possible to control the temperature of the surface of the substrate within a predefined temperature range.

The diameter of the filaments can also be increased to intensify the heat emitted by irradiation.

The filaments have a diameter ranging from 0.2 mm to 0.8 mm, and preferably a diameter of 0.5 mm±1 mm.

These dimensions both enable the substrate 1 to be sufficiently heated, by irradiation, and at the same time enable outgassing of parasite species to be limited when a vacuum is created in the reaction chamber 3.

Advantageously, a vacuum creation step is performed. The vacuum creation step is for example performed at $5 \times 10^{-6}$ Torr.

Outgassing takes place at the level of the carbon source at the time the filaments are placed under tension. The substrate 1 can be contaminated by parasite carbon particles leading to the formation of an amorphous carbon film. A reduction of the surface of the carbon source enables this phenomenon to be limited.

It has been observed that, for filaments having a diameter smaller than or equal to 0.4 mm, the contamination by parasite carbon is negligible. The number of filaments used can also be reduced.

The carbon source 2 is arranged above the surface of the substrate 1, at a distance comprised between 0.5 cm and 2.5 cm, and preferably between 0.8 cm and 1.2 cm. Preferentially, the carbon source is at a distance greater than or equal to the distance between the filaments to have a uniform heating.

The distance between the filaments and the surface of the substrate 1 can also be configured to have an effect on the lifetime of the radical species.

According to another embodiment, the substrate can be cooled to stabilise the temperature or to fabricate a graphene film with small grains.

According to a particular embodiment, as represented in FIG. 2, a metal grid 7 is placed between the substrate 1 and the carbon source 2. The grid 7 enables the number of parasite particles reaching the sample when outgassing takes place to be reduced. The parasite carbonaceous species, when they reach the grid 7, will be absorbed by the metal of the grid.

The metal grid 7 is for example made from nickel. Dissolution of carbon in nickel is relatively high: a nickel grid forms an efficient trap for carbonaceous particles.

The metal grid 7 also enables the formation rate of the graphene film to be controlled. By adjusting the dimensions of the openings of the grid 7, it is possible to increase or reduce the quantity of carbonaceous radicals reaching the substrate 1.

According to another embodiment, the grid 7 could be formed by an optically transparent material, such as quartz for example.

Figure 3:
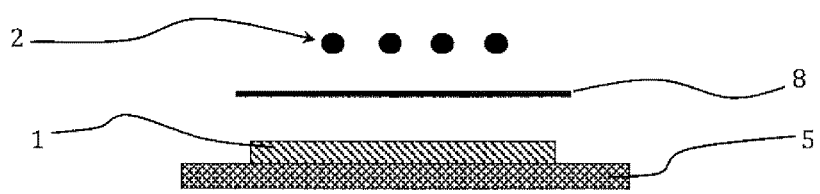

According to another particular embodiment, as represented in FIG. 3, a shutter 8 is placed between the substrate 1 and carbon source 2. The shutter 8 is made from an optically transparent material. It is for example made from quartz.

The shutter 8 is closed when the temperature rise takes place. Even if the shutter 8 is closed, the heat emitted by the filaments is transmitted to the surface of the substrate 1 by irradiation through the shutter transparent to the irradiation wavelength.

The shutter 8 enables the sample to be heated while at the same time preventing deposition of parasite carbon on the sample during pumping and temperature increase. The shutter 8 is open when the maximum temperature is reached and during the temperature plateau.

At this time, the kinetic energy of the carbonaceous species will be sufficient to form a single layer of well-structured graphene.

According to another embodiment, the shutter 8 is placed between the substrate 1 and carbon source 2 and it is closed when the temperature increase takes place and during the temperature plateau. It is kept closed when the maximum temperature is reached. The shutter 8 is kept in the same position throughout the method. The shutter 8 can be a solid shield. The formation rate of the graphene film is thus reduced and the film is more homogeneous.

The use of a grid 7 and/or of a shutter 8 acts as a filter and enables a precise control of the quantity of carbonaceous species reaching the substrate 1, thereby improving the quality of the graphene film.

The different embodiments described above can be implemented either alone or in combination with one another.

Preferentially, the substrate 1 is formed by a bulk material covered by a metallic thin layer. Preferentially, the metal is a transition metal, such as Cu, Pt, Fe, Ni, Au, Ir, Ru, etc.

Advantageously, the transition metals have a catalytic effect when formation of the graphene takes place.

The metallic thin film has a thickness comprised between 100 nm and 400 nm, and preferably between 100 nm and 300 nm.

Preferentially, the thin layer is made from a transition metal chosen from platinum, copper, titanium or nickel. It can also be made from an alloy of these metals, such as for example a platinum alloy containing from 0.5% to 10% of iridium.

Even more preferentially:
the bulk material is made from silicon,
the metallic thin film is made from platinum,
a chromium layer, having a thickness of 20 nm±5 nm, is arranged between the silicon and the metallic thin layer.

The silicon bulk material can be formed by a silicon film covered by a thin layer of silicon oxide $SiO_2$.

Platinum presents several advantages for growth of a uniform graphene film.

Platinum has a very high melting temperature (1768° C.) and a relatively low thermal expansion coefficient (less than 9 μm/mK). During the formation process of the graphene film, and in particular during the heat treatment, the thin layer of platinum will be less subjected to mechanical stresses than another metallic layer. The graphene film will present less defects.

Furthermore, it is very difficult or even impossible to make platinum oxidise, even during temperature increases/decreases. The surface roughness of the platinum thin film remains low.

The use of platinum also makes it possible to subsequently easily transfer the graphene film onto another support, by electrochemistry for example.

Once the graphene film has been removed, the substrate can be used for another deposition.

The presence of the chromium layer makes for a better adhesion between the platinum and the silicon.

The method is not limited to thin substrates, and in particular to wafers. According to other embodiments, the substrate could be a bulk substrate, for example a platinum sheet.

The device configured to fabricate a graphene film on a substrate 1 comprises:
- a reaction chamber 3 provided with a carbon source 2 and a support 5, said support 5 being designed to secure a substrate 1,
- a gas inlet 4 configured to form a gas flow directed from the gas inlet 4 to the carbon source 2,
- a heating device configured to heat the solid carbon source.

The carbon source is a solid carbon source. The gas entering the reaction chamber is devoid of hydrocarbon. The gas entering the reaction chamber is devoid of carbonaceous organic molecules.

The carbon source 2 is preferably formed by at least one filament.

Preferentially, the carbon source 2 comprises several filaments, parallel to the surface of the substrate.

Preferentially, the gas flow is perpendicular to the surface of the substrate 1 and to the plane formed by the carbon filaments.

Preferentially, the carbon source 2 is graphite.

The carbon source is arranged in the reaction chamber so as to be above the surface of the substrate, at a distance comprised between 0.5 cm and 1.5 cm, and preferably between 0.8 cm and 1.2 cm.

As only a very small part of the carbon source 2 is used for each graphene deposition, the carbon source 2 has a relatively long lifetime.

The method will now be described by means of the following example, naturally given for illustrative and non-restrictive purposes only.

Figure 4:
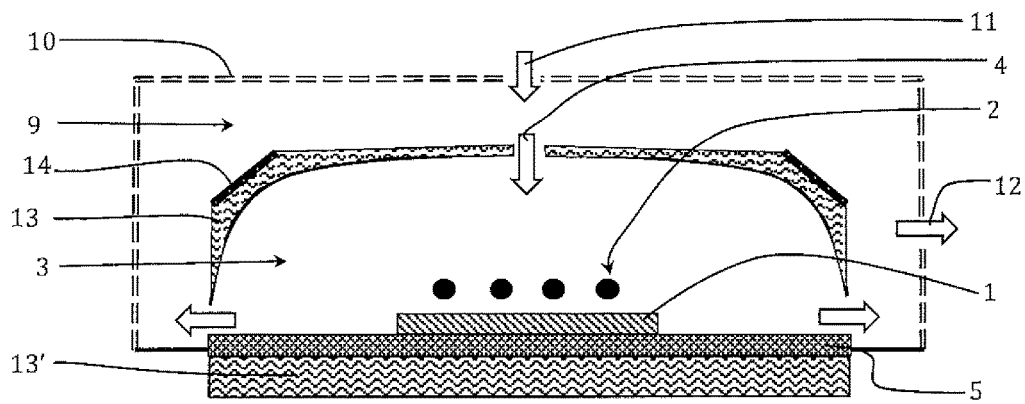

FIG. 4 represents the device configured to fabricate a graphene film, in schematic manner and in cross-section. For a better clarity of viewing, the different components of the device are not drawn to scale.

The device enables graphene to be grown by CVD at low temperature.

The reaction chamber 3 is a quartz bell. The bottom part of the reaction chamber 3 comprises the sample holder 5.

The reaction chamber 3 can be arranged in a closed enclosure 9.

The walls between the inside of the enclosure and the outside of the enclosure 9 are double walls 10 in which a coolant liquid flows.

The enclosure 9 is provided with a gas inlet 11 and a gas outlet 12.

The device comprises a pumping system enabling a vacuum to be created in the reaction chamber. The pumping system is located for example at the level of the gas inlet 11 of the enclosure 9.

The reaction chamber 3 can be heated by means of heating coils 13.

The coils are arranged against the outer walls of the reaction chamber 3.

Thermal shields 14 can also be placed on the outside of the reaction chamber 3, between the heating coils 13 and the inside of the enclosure 11, to thermally insulate the reaction chamber 3 from the enclosure 11.

The thermal shields 10 are thermal insulators.

The sample holder 5 can also be heated by heating coils 13'.

In this example, the filaments are made from graphite. They have a length of 110 mm and a diameter of 0.5 mm.

The filaments are located 1 cm from the substrate 1. They are parallel to the surface of the substrate 1. The space between each filament is 1 cm.

The filaments cover the substrate over a surface of 10 cm×10 cm.

The sample holder 5 is made from silicon.

The substrate 1 is formed by a stack successively comprising:
- a silicon wafer with a thickness of 0.5 mm,
- a thin layer of $SiO_2$ covering the silicon wafer, the thin layer of $SiO_2$ having a thickness of 500 nm,
- a thin layer of chromium with a thickness of 20 nm,
- a thin layer of platinum having a thickness of 200 nm.

The thin layer of platinum was deposited by evaporation by electron beam on the silicon wafer. The thin layer of platinum thus produced is polycrystalline.

The reaction chamber 3 is, in a first step, cleaned with an oxygen plasma to remove any carbon parasite element. The filaments are then placed in the reaction chamber.

The filaments are heated by a power supply delivering a power of 800 W, under a dihydrogen flux, which enables them to be cleaned and outgassed.

The substrate 1 is placed in the reaction chamber 3, on the sample holder 5.

The sample holder 5 is heated to 700° C. The temperature increase from ambient temperature up to 700° C. lasts for 10 minutes.

The hydrogen pressure is 7 Torr for a flux of 100 cm³/min (or 100 sccm standing for standard cubic centimeter per minute).

The temperature plateau is maintained for a period ranging from 5 minutes to 60 minutes; this plateau enables the graphene to be synthesised.

Then the reaction chamber 3 is cooled to ambient temperature.

The dihydrogen pressure can be identical during the temperature increase and during the temperature plateau.

Alternatively, a first pressure can be used during the temperature increase and a second pressure be used during the temperature plateau.

Figure 5:
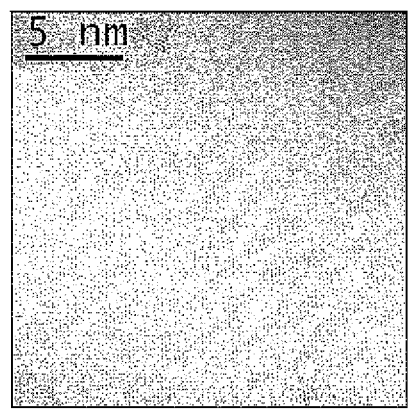
FIG. 5 represents a snapshot obtained by transmission electron microscopy of a graphene film produced according to the fabrication method.
Figure 6:
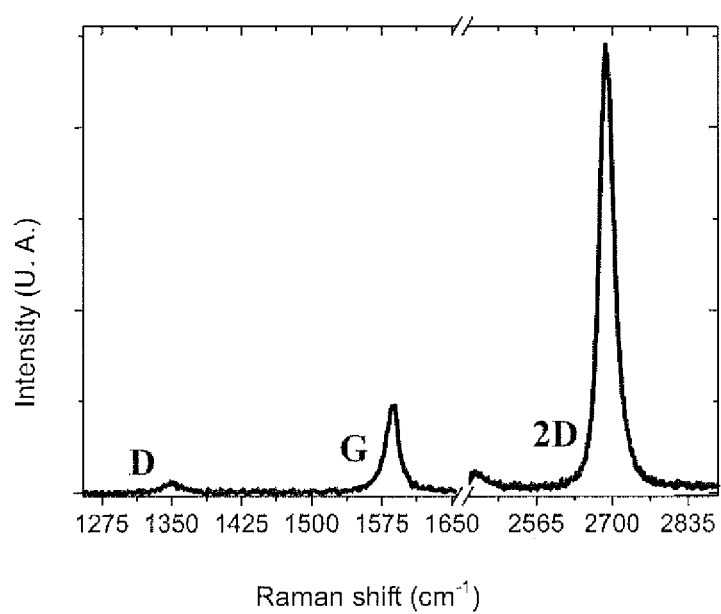
FIG. 6 represents a $1^{st}$ and $2^{nd}$ order Raman spectrum of the graphene film of FIG. 4.

The Raman spectrum and the snapshot obtained by Transmission Electron Microscopy, made on the graphene sample obtained, and respectively represented in FIGS. 5 and 6, confirm that the graphene sample is well and truly in the form of a single graphene film (or SLG standing for Single Layer Graphene). The film is uniform with very few defects.

The method described above is performed at a temperature that is sufficiently high to activate hydrogen, but sufficiently low to at the same time prevent dewetting phenomena. Furthermore, with such a temperature, a small quantity of carbon radicals is generated, enhancing the formation of a homogeneous and continuous graphene film.

The thermal gradient enables activation of the carbon while at the same time ensuring a good physico-chemical resistance of the graphene layer.

The method makes it possible to form a graphene film formed by a carbon monolayer at low temperature on metallic thin films.

In particular, the size of the graphene crystallites is controlled in continuous manner. Continuous, hole-free, graphene films are obtained whatever the size of the crystallites.

The graphene films are particularly interesting for numerous applications, and in particular for microelectronics, spin electronics, or for applications requiring conducting transparent films.

The invention claimed is:

1. Fabrication method of a graphene film comprising the following successive steps:
placing a substrate and a solid carbon source in a reaction chamber, provided with a gas inlet,
heating the solid carbon source, by flow of a current in said solid carbon source, under a gas flow, the gas being devoid of carbonaceous organic molecules, so as to convert at least a part of the solid carbon source into the graphene film on a surface of the substrate, the solid carbon source emitting an irradiation wavelength heating the surface of the substrate,
wherein a shutter made from a material transparent to the irradiation wavelength is disposed between the substrate and the solid carbon source so that heat emitted by the solid carbon source is transmitted to the surface of the substrate by irradiation through the shutter, the shutter being configured to control a quantity of carbonaceous species reaching the substrate from the solid carbon source and to control a graphene growth rate.

2. Method according to claim 1, wherein during the heating step, the temperature of the substrate is lower than or equal to 800° C.

3. Method according to claim 2, wherein during the heating step, the temperature of the substrate is lower than or equal to 700° C.

4. Method according to claim 1, wherein the substrate is heated only by the solid carbon source.

5. Method according to claim 1, wherein the solid carbon source is arranged above a surface of the substrate, at a distance comprised between 0.5 cm and 2.5 cm.

6. Method according to claim 5, wherein the distance is comprised between 0.8 cm and 1.2 cm.

7. Method according to claim 1, wherein the substrate is formed by a bulk material covered by a metallic thin layer, said metallic thin layer having a thickness comprised between 100 nm and 400 nm.

8. Method according to claim 7, wherein the metallic thin layer is made from platinum, copper, titanium or nickel or is formed by a platinum alloy containing from 0.5% to 10% of iridium.

9. Method according to claim 7, wherein:
the bulk material is made from silicon,
the metallic thin layer is made from platinum,
a chromium layer, having a thickness of 20 nm±5 nm, is arranged between the silicon and the metallic thin layer.

10. Method according to claim 1, wherein the shutter is closed when a temperature increase takes place in the heating step and the shutter is open during a temperature plateau in the heating step.

11. Method according to claim 1, wherein the shutter is closed when a temperature increase takes place in the heating step and during a temperature plateau in the heating step.

12. Method according to claim 1, further comprising maintaining a temperature of the substrate lower than or equal to 800° C.

13. Method according to claim 1, wherein the gas inlet provides a gas flow perpendicular to the surface of the substrate.

14. Method according to claim 1, wherein heating the solid carbon source is configured to define a thermal gradient between the solid carbon source and the surface of the substrate so as to form homogeneous and continuous graphene film.

15. Fabrication method of a graphene film comprising the following successive steps:
placing a substrate and a solid carbon source in a reaction chamber, provided with a gas inlet,
heating the solid carbon source, by flow of a current in said solid carbon source, under a gas flow, the gas being devoid of carbonaceous organic molecules, so as to convert at least a part of the solid carbon source into the graphene film on a surface of the substrate,
wherein a grid is arranged between and spaced apart from the substrate and the solid carbon source, the grid being devoid of physical contact with the substrate and being made from nickel or quartz.

* * * * *